United States Patent
Tseng

(10) Patent No.: US 9,065,480 B1
(45) Date of Patent: Jun. 23, 2015

(54) DIGITAL-TO-ANALOG CONVERTER APPARATUS HAVING A RECONFIGURABLE RESISTOR-CAPACITOR CIRCUIT

(71) Applicant: MEDIATEK INC., Hsin-Chu (TW)

(72) Inventor: Wei-Hsin Tseng, Changhua County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/290,981

(22) Filed: May 29, 2014

Related U.S. Application Data

(60) Provisional application No. 61/932,828, filed on Jan. 29, 2014.

(51) Int. Cl.
*H03M 1/06* (2006.01)
*H03M 1/68* (2006.01)
*H03M 1/00* (2006.01)
*H03M 1/70* (2006.01)

(52) U.S. Cl.
CPC ............ *H03M 1/68* (2013.01); *H03M 1/002* (2013.01); *H03M 1/0617* (2013.01); *H03M 1/70* (2013.01)

(58) Field of Classification Search
CPC ..... H03M 1/68; H03M 1/0617; H03M 1/002; H03M 1/70
USPC .................... 341/118, 120, 143, 155
See application file for complete search history.

(56) References Cited

U.S. PATENT DOCUMENTS 6,646,581 B1 * 11/2003 Huang ........................ 341/143
2010/0164765 A1 * 7/2010 Miyahara et al. ............. 341/120

* cited by examiner

*Primary Examiner* — Khai M Nguyen
(74) *Attorney, Agent, or Firm* — Winston Hsu; Scott Margo

(57) ABSTRACT

A digital-to-analog converter apparatus includes a digital-to-analog converter, a resistor-capacitor circuit, a quantizer and a controller. The resistor-capacitor circuit includes an operational amplifier, a first capacitor, a second capacitor, a first resistor, a second resistor, a first switch and a second switch. The digital-to-analog converter may generate a plurality of currents. The quantizer may generate a plurality of offset values. The controller may control coupling of the plurality of currents to the operational amplifier.

19 Claims, 6 Drawing Sheets

| G1 | G2 | Error | Step |
|---|---|---|---|
| $\Sigma I_L$, $I_{64}(9)$, $I_{64}(10)$, $I_{64}(11)$, $I_{64}(12)$, $I_{64}(13)$, $I_{64}(14)$, $I_{64}(15)$, | $I_{64}(1)$, $I_{64}(2)$, $I_{64}(3)$, $I_{64}(4)$, $I_{64}(5)$, $I_{64}(6)$, $I_{64}(7)$, $I_{64}(8)$, | $E_{os} = \Sigma D_{OUT}$ | Residual offset |
| $I_{64}(1)$, $I_{64}(9)$, $I_{64}(10)$, $I_{64}(11)$, $I_{64 \times 12}$, $I_{64}(13)$, $I_{64}(14)$, $I_{64}(15)$, | $\Sigma I_L$, $I_{64}(2)$, $I_{64}(3)$, $I_{64}(4)$, $I_{64}(5)$, $I_{64}(6)$, $I_{64}(7)$, $I_{64}(8)$, | $E_1 = \Sigma D_{OUT} - E_{os}$ | Store $E_{s1} = E_1$ |
| $I_{64}(2)$, $I_{64}(9)$, $I_{64}(10)$, $I_{64}(11)$, $I_{64}(12)$, $I_{64}(13)$, $I_{64}(14)$, $I_{64}(15)$, | $\Sigma I_L$, $I_{64}(1)$, $I_{64}(3)$, $I_{64}(4)$, $I_{64}(5)$, $I_{64}(6)$, $I_{64}(7)$, $I_{64}(8)$, | $E_2 = \Sigma D_{OUT} - E_{os}$ | Store $E_{s2} = E_{s1} + E_2$ |
| $I_{64}(3)$, $I_{64}(9)$, $I_{64}(10)$, $I_{64}(11)$, $I_{64}(12)$, $I_{64}(13)$, $I_{64}(14)$, $I_{64}(15)$, | $\Sigma I_L$, $I_{64}(1)$, $I_{64}(2)$, $I_{64}(4)$, $I_{64}(5)$, $I_{64}(6)$, $I_{64}(7)$, $I_{64}(8)$, | $E_3 = \Sigma D_{OUT} - E_{os}$ | Store $E_{s3} = E_{s2} + E_3$ |
| ... | ... | ... | ... |
| $I_{64}(8)$, $I_{64}(9)$, $I_{64}(10)$, $I_{64}(11)$, $I_{64}(12)$, $I_{64}(13)$, $I_{64}(14)$, $I_{64}(15)$, | $\Sigma I_L$, $I_{64}(1)$, $I_{64}(2)$, $I_{64}(3)$, $I_{64}(4)$, $I_{64}(5)$, $I_{64}(6)$, $I_{64}(7)$, | $E_8 = \Sigma D_{OUT} - E_{os}$ | Store $E_{s8} = E_{s7} + E_8$ |

FIG. 5

| G1 | G2 | Error | Step |
|---|---|---|---|
| $\Sigma I_L$, $I_{64(1)}$, $I_{64(2)}$, $I_{64(3)}$, $I_{64(4)}$, $I_{64(5)}$, $I_{64(6)}$, $I_{64(7)}$, | $I_{64(8)}$, $I_{64(9)}$, $I_{64(10)}$, $I_{64(11)}$, $I_{64(12)}$, $I_{64(13)}$, $I_{64(14)}$, $I_{64(15)}$, | $E_{os} = \Sigma D_{OUT}$ | Residual offset |
| $I_{64(9)}$, $I_{64(1)}$, $I_{64(2)}$, $I_{64(3)}$, $I_{64(4)}$, $I_{64(5)}$, $I_{64(6)}$, $I_{64(7)}$, | $\Sigma I_L$, $I_{64(8)}$, $I_{64(10)}$, $I_{64(11)}$, $I_{64(12)}$, $I_{64(13)}$, $I_{64(14)}$, $I_{64(15)}$, | $E_9 = \Sigma D_{OUT} - E_{OS}$ | Store $E_{s9} = E_{s8} + E_9$ |
| $I_{64(10)}$, $I_{64(1)}$, $I_{64(2)}$, $I_{64(3)}$, $I_{64(4)}$, $I_{64(5)}$, $I_{64(6)}$, $I_{64(7)}$, | $\Sigma I_L$, $I_{64(8)}$, $I_{64(9)}$, $I_{64(11)}$, $I_{64(12)}$, $I_{64(13)}$, $I_{64(14)}$, $I_{64(15)}$, | $E_{10} = \Sigma D_{OUT} - E_{OS}$ | Store $E_{s10} = E_{s1} + E_2$ |
| $I_{64(11)}$, $I_{64(1)}$, $I_{64(2)}$, $I_{64(3)}$, $I_{64(4)}$, $I_{64(5)}$, $I_{64(6)}$, $I_{64(7)}$, | $\Sigma I_L$, $I_{64(8)}$, $I_{64(9)}$, $I_{64(10)}$, $I_{64(12)}$, $I_{64(13)}$, $I_{64(14)}$, $I_{64(15)}$, | $E_{11} = \Sigma D_{OUT} - E_{OS}$ | Store $E_{s11} = E_{s10} + E_{11}$ |
| ... | ... | ... | ... |
| $I_{64(15)}$, $I_{64(1)}$, $I_{64(2)}$, $I_{64(3)}$, $I_{64(4)}$, $I_{64(5)}$, $I_{64(6)}$, $I_{64(7)}$, | $\Sigma I_L$, $I_{64(8)}$, $I_{64(9)}$, $I_{64(10)}$, $I_{64(11)}$, $I_{64(12)}$, $I_{64(13)}$, $I_{64(14)}$, | $E_{15} = \Sigma D_{OUT} - E_{OS}$ | Store $E_{s15} = E_{s14} + E_{15}$ |

DIGITAL-TO-ANALOG CONVERTER APPARATUS HAVING A RECONFIGURABLE RESISTOR-CAPACITOR CIRCUIT

CROSS REFERENCE TO RELATED APPLICATIONS

This non-provisional application claims priority of U.S. provisional application 61/932,828, filed on Jan. 29, 2014, and included herein by reference.

BACKGROUND

A digital-to-analog converter (DAC) has always been utilized to convert a digital modulated signal into an analog signal for transmission. When designing a communication system, it is usually assumed that the utilized DAC is an ideal component. That is, the utilized DAC is regarded as an ideal DAC, which convert a digital signal into a corresponding analog signal without distortion.

However, in reality, digital-to-analog converter (DAC) faces problems in accuracy caused by mismatches in the devices within the digital-to-analog converter (DAC). In order to compensate for the mismatches, digital-to-analog converter (DAC) is calibrated before used in a conversion. Conventional digital-to-analog converter (DAC) calibration techniques are performed in the background or offline, and require an extra high accuracy analog to digital circuit (ADC) to digitize the digital-to-analog converter (DAC) cell mismatch. However, use of high accuracy analog to digital circuit (ADC) may result to a large fabrication area penalty.

SUMMARY

An embodiment of the present invention is a digital-to-analog converter apparatus. The digital-to-analog converter apparatus comprises a digital-to-analog converter, a resistor-capacitor circuit, a quantizer, and a controller. The digital-to-analog converter has an input bus terminal, a first output terminal, a second output terminal, and a plurality of control terminals, and configured to generate a plurality of currents. The resistor-capacitor circuit comprises an operational amplifier having a first input terminal coupled to the first output terminal of the digital-to-analog converter, a second input terminal coupled to the second output terminal of the digital-to-analog converter, a first output terminal, and a second output terminal; a first capacitor having a first terminal coupled to the first input terminal of the operational amplifier and a second terminal coupled to the first output terminal of the operational amplifier; a second capacitor having a first terminal coupled to the second input terminal of the operational amplifier and a second terminal coupled to the second output terminal of the operational amplifier; a first resistor having a first terminal coupled to the first input terminal of the operational amplifier and a second terminal; a second resistor having a first terminal coupled to the second input terminal of the operational amplifier and a second terminal; a first switch having a first terminal coupled to the second terminal of the first resistor, a second terminal selectively coupled to a common mode voltage or to the first output terminal of the operational amplifier; and a second switch having a first terminal coupled to the second terminal of the second resistor, a second terminal selectively coupled to the common mode voltage or to the second output terminal of the operational amplifier. The quantizer has a first input terminal coupled to the first output terminal of the operational amplifier, a second input terminal coupled to the second output terminal of the operational amplifier, and an output terminal, and configured to generate a plurality of offset values according to outputs of the operational amplifier. The controller has an input terminal coupled to the output terminal of the quantizer and an output bus terminal coupled to the plurality of control terminals of the digital-to-analog converter, and is configured to control coupling of the plurality of currents to the operational amplifier according to the plurality of offset values. The resistor-capacitor circuit is configured to form an integrator to form a sigma delta analog-to-digital converter during calibration and configured to form a low-pass filter during a digital-to-analog conversion Another embodiment of the present invention is a method of operation of a digital-to-analog converter apparatus. The method comprises configuring a resistor-capacitor circuit to form an integrator, generating a plurality of currents by a digital-to-analog converter, performing integration on the plurality of currents by the integrator to generate outputs, generating a plurality of offset values according to the outputs of the integrator, saving the plurality of offset values to an error mapping table of the digital-to-analog converter, calibrating the digital-to-analog converter according to the plurality of offset values, configuring the resistor-capacitor circuit to forma low-pass filter, propagating a digital signal through the digital-to-analog converter and the resistor-capacitor circuit after calibrating the digital-to-analog converter and forming the low-pass filter, performing error compensation to the digital signal according to the plurality of offset values saved in the error mapping table, and generating an analog signal according to the digital signal.

An additional embodiment of the present invention is a method of calibration of a digital-to-analog converter apparatus. The method comprises summing a plurality of least-significant-bit currents by a digital-to-analog converter to generate a sum current, integrating each of a plurality of most-significant-bit currents and the sum current by an integrator to generate a plurality of outputs, quantizing of the plurality of outputs by a quantizer to generate a plurality of offset values, and saving each of the plurality of offset values on an error mapping table of the digital-to-analog converter. The sum current is placed in a first group and the plurality of most-significant-bit currents is placed in a second group when summing the plurality of least-significant-bit currents to generate the sum current.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a table of calibration of each of a part of the plurality of most-significant-bit currents of the digital-to-analog converter apparatus in FIG. 1.

FIG. 6 is a table of calibration of each of another part of the plurality of most-significant-bit currents and of the digital-to-analog converter apparatus in FIG. 1.

DETAILED DESCRIPTION

Figure 1:
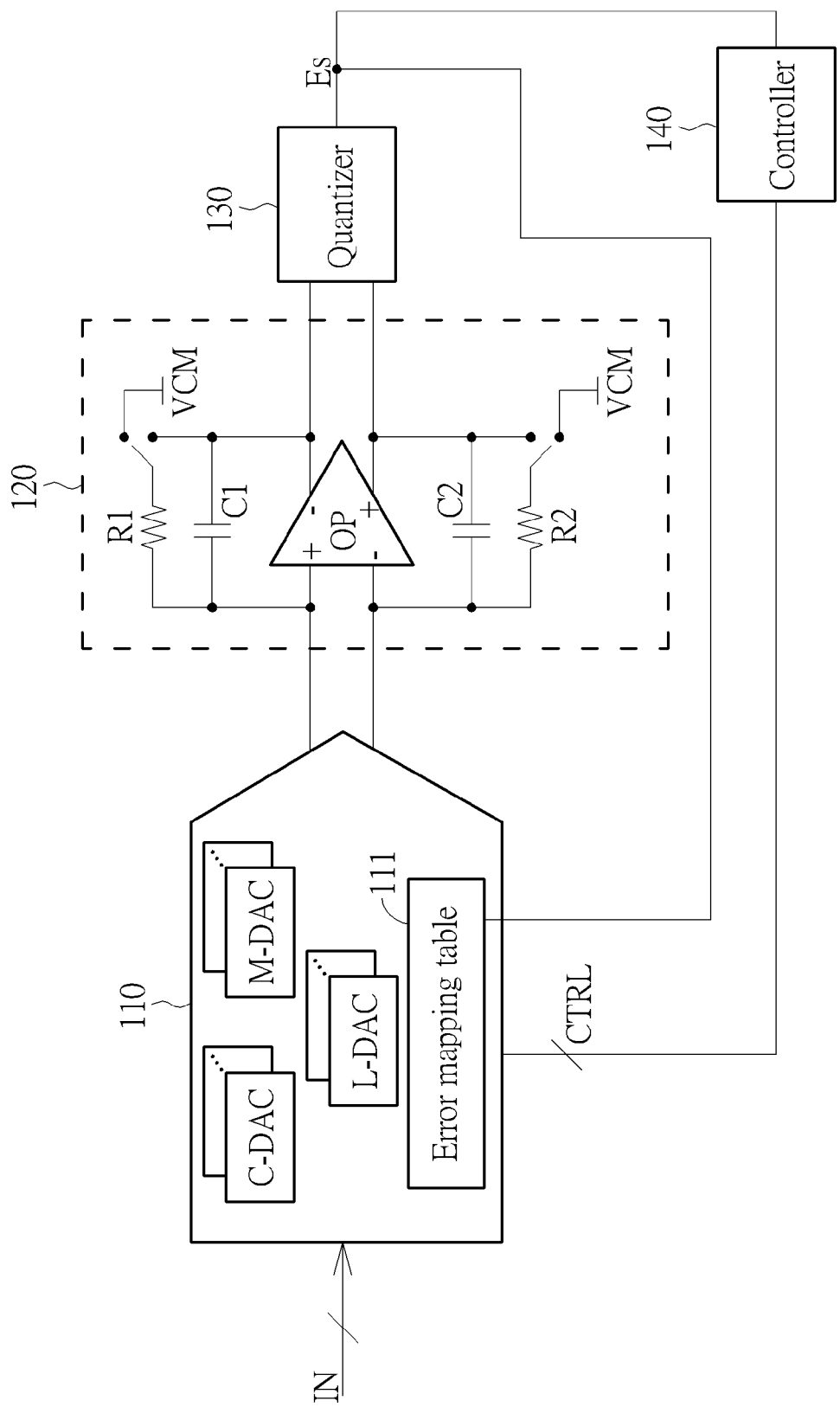
FIG. 1 is a block diagram of a digital-to-analog converter apparatus according to an embodiment of the present invention.

FIG. 1 is a block diagram of a digital-to-analog converter apparatus 100 according to an embodiment of the present invention. The digital-to-analog converter apparatus 100 comprises a digital-to-analog converter 110, a resistor-capacitor circuit 120, a quantizer 130, and a controller 140. The digital-to-analog converter 110 has an input bus terminal IN, a first output terminal, a second output terminal, and a plurality of control terminals CTRL. There may be N input bits on the input bus terminal IN and N number of control terminals CTRL for an N-bit digital-to-analog converter apparatus. The digital-to-analog converter 110 may be used generate a plurality of currents. The plurality of currents may be generated by a plurality of current cells of the digital-to-analog converter 110 coupled to the output bus terminal of the controller 140. At least one of the plurality of current cells may be used to generate a reference current and at least two current cells may be used to generate offset cancellation currents. The digital-to-analog converter 110 further comprises an error mapping table 111 to store the plurality of offset values. Furthermore, the digital-to-analog converter 110 may not turn off at any time during operation to reduce power consumption.

The resistor-capacitor circuit 120 comprises an operational amplifier OP, a first capacitor C1, a second capacitor C2, a first resistor R1, a second resistor R2, a first switch SW1, and a second switch SW2. The operational amplifier OP has a first input terminal coupled to the first output terminal of the digital-to-analog converter 110, a second input terminal coupled to the second output terminal of the digital-to-analog converter 110, a first output terminal, and a second output terminal. The first input terminal of the operational amplifier OP may be a positive input terminal and the second input terminal of the operational amplifier OP may be a negative input terminal. The first output terminal of the operational amplifier OP may be a negative output terminal and the second output terminal of the operational amplifier OP may be a positive output terminal. The first capacitor C1 has a first terminal coupled to the first input terminal of the operational amplifier OP and a second terminal coupled to the first output terminal of the operational amplifier OP. The second capacitor C2 has a first terminal coupled to the second input terminal of the operational amplifier OP and a second terminal coupled to the second output terminal of the operational amplifier OP. The first resistor R1 has a first terminal coupled to the first input terminal of the operational amplifier OP and a second terminal. The second resistor R2 has a first terminal coupled to the second input terminal of the operational amplifier OP and a second terminal. The first switch SW1 has a first terminal coupled to the second terminal of the first resistor R1, a second terminal selectively coupled to a common mode voltage VCM or to the first output terminal of the operational amplifier OP. The second switch SW2 has a first terminal coupled to the second terminal of the second resistor R2, a second terminal selectively coupled to the common mode voltage VCM or to the second output terminal of the operational amplifier OP. The resistor-capacitor circuit 120 may be used to form an integrator during calibration and form a low-pass filter during a digital to analog conversion. Furthermore, the first capacitor C1 and the second capacitor C2 may be adjustable to change frequency three dB for different modes of the resistor-capacitor circuit 120.

The quantizer 130 has a first input terminal coupled to the first output terminal of the operational amplifier, a second input terminal coupled to the second output terminal of the operational amplifier, and an output terminal. The quantizer 130 may be used to generate a plurality of offset values according to outputs of the operational amplifier.

The controller 140 has an input terminal coupled to the output terminal of the quantizer 130, and an output bus terminal coupled to the plurality of control terminals CTRL of the digital-to-analog converter. The controller 140 may be used to control coupling of the plurality of currents to the operational amplifier according to the plurality of offset values.

Figure 2:
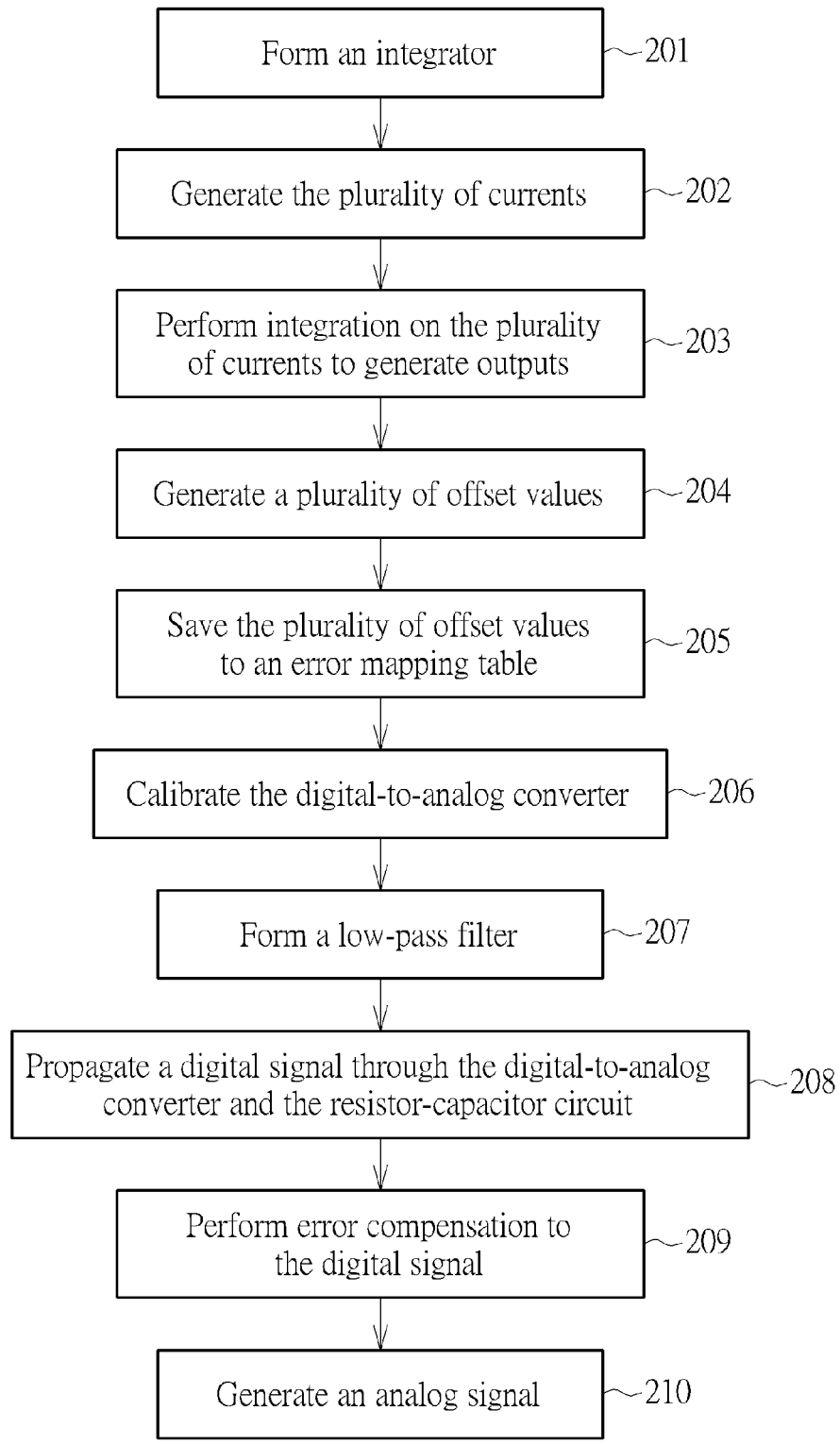
FIG. 2 is a flowchart of a method of operation of the digital-to-analog converter apparatus in FIG. 1.

As an example, the following article may refer to a 10 bit digital-to-analog converter. FIG. 2 is a flowchart of a method of operation of the digital-to-analog converter apparatus 100 in FIG. 1. The method may include but is not limited to the following steps:

Step 201: Configure the resistor-capacitor circuit 120 to form an integrator to form a sigma delta analog-to-digital converter;

Step 202: Generate the plurality of currents by the digital-to-analog converter 110;

Step 203: Perform integration on the plurality of currents to generate outputs by the integrator;

Step 204: Generate a plurality of offset values according to the outputs of the integrator;

Step 205: Save the plurality of offset values to an error mapping table 111 of the digital-to-analog converter 110;

Step 206: Calibrate the digital-to-analog converter 110 according to the plurality of offset values;

Step 207: Configure the resistor-capacitor circuit 120 to form a low-pass filter;

Step 208: Propagate a digital signal through the digital-to-analog converter 110 and the resistor-capacitor circuit 120 after calibrating the digital-to-analog converter 110 and forming the low-pass filter;

Step 209: Perform error compensation to the digital signal according to the plurality of offset values saved in the error mapping table 111; and Step 210: Generate an analog signal according to the digital signal.

In step 201, the integrator is formed by having the second terminal of the first switch SW1 and the second switch SW2 of the resistor-capacitor circuit 120 selectively coupled to the common mode voltage VCM. The integrator together with the digital-to-analog converter 110, the quantizer 130, and the controller 140 may form the sigma delta analog-to-digital converter.

In step 202, the plurality of current cells of the digital-to-analog converter 110 used to generate the plurality of currents may include calibration current cells C-DAC used to generate at least one reference current $I_{8A}$ and/or $I_{8B}$ and at least two offset cancellation currents $I_{8C}$ and $I_{8D}$, least-significant-bit current cells L-DAC used to generate a plurality of least-significant-bit currents, and most-significant-bit current cells M-DAC used to generate a plurality of most-significant-bit currents $I_{64(1)}$ to $I_{64(15)}$. Furthermore, the calibration current cells C-DAC may further comprise of fine current cells having a value of ½ one half, ¼ one quarter, and ⅛ one eighth of current. The at least one reference current $I_{8A}$ and/or $I_{8B}$ and at least two offset cancellation currents $I_{8C}$ and $I_{8D}$ may be used to extend calibration range and the three fine current cells may be used to increase correction resolution.

Figure 3:
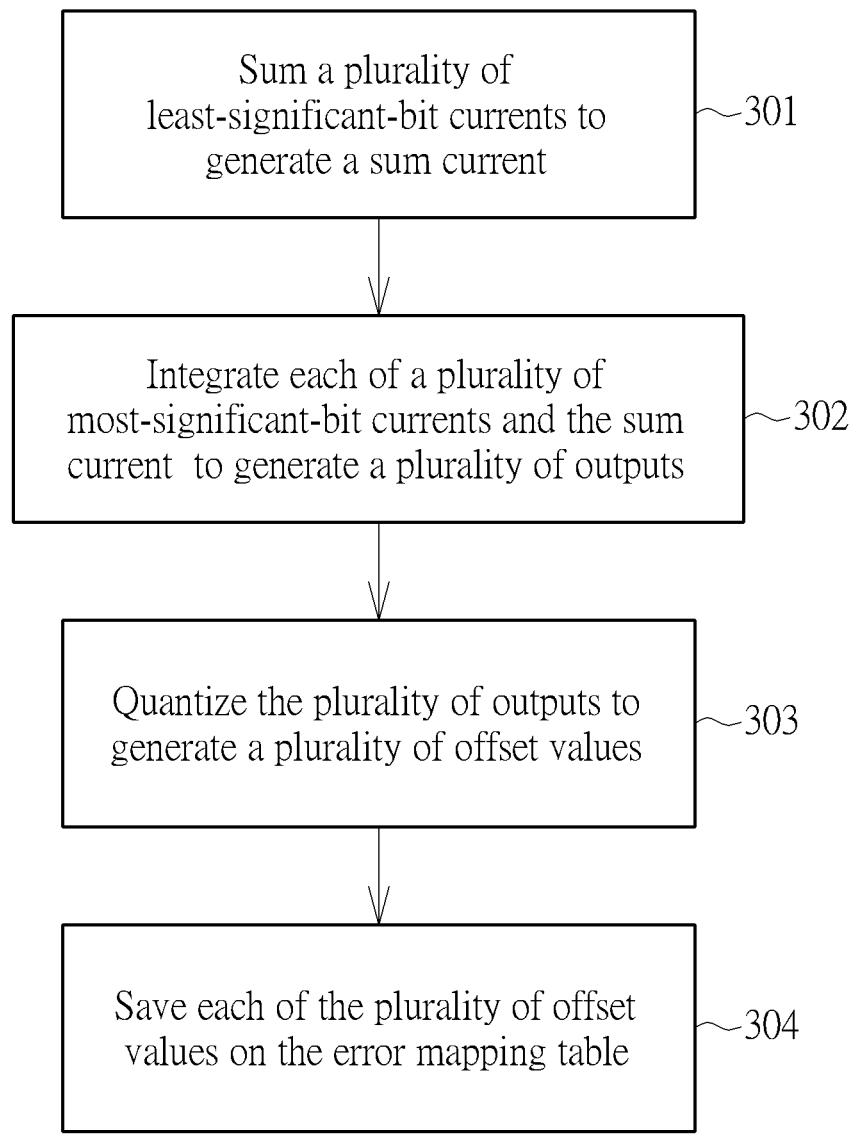
FIG. 3 is a flowchart of a method of calibration of the digital-to-analog converter apparatus in FIG. 1.

In steps 203, 204 and 205, the plurality of offset values $E_S$ may be generated according to the plurality of currents in step 202. Steps 203, 204 and 205 are more explicitly shown in FIG. 3, which is a flowchart of a method of calibration of the digital-to-analog converter apparatus 100 in FIG. 1. The method may include but is not limited to the following steps:

Step 301: Sum a plurality of least-significant-bit currents by a digital-to-analog converter 110 to generate a sum current $\Sigma I_L$;

Step 302: Integrate each of a plurality of most-significant-bit currents $I_{64(1)}$ to $I_{64(15)}$ and the sum current $\Sigma I_L$ by an integrator to generate a plurality of outputs;

Step 303: Quantize the plurality of outputs utilizing the quantizer 130 to generate a plurality of offset values $E_S$; and Step 304: Save each of the plurality of offset values $E_S$ on the error mapping table 111 of the digital-to-analog converter 110.

In step 301, the plurality of least-significant-bit currents may be summed up to generate the sum current $\Sigma I_L$. The sum current $\Sigma I_L$ may also include the sum of the plurality of currents $I_{8A}$, $I_{8B}$, $I_{8C}$ and $I_{8D}$. The sum current $\Sigma I_L$ may be placed in a first group Gn. The most-significant-bit current $I_{64}$ to be calibrated may be placed in a second group G2. The remaining currents may be divided into the first G1 and the second group G2 to keep the net current smaller than the full swing of the analog-to-digital converter 110. The currents of the first group G1 may be coupled to the positive terminal of the operational amplifier OP. The currents of the second group may be coupled to the negative input terminal of the operational amplifier OP. The full swing of the analog-to-digital converter may be determined according to the at least one reference current $I_{8A}$ and/or $I_{8B}$. The at least two offset cancellation currents $I_{8C}$ and $I_{8D}$ may be used to compensate for overshoot of currents in the first group G1 and second group G2.

In step 302, integration of each of a plurality of most-significant-bit currents and the sum current may be implemented by the integrator. The outputs of the integrator may include a residual offset $\Sigma D$ and a plurality of errors E1 to E15.

After each of the plurality of errors E1 to E15 is determined, the quantizer 130 may be used to quantize each of the plurality of errors E1 to E15 and determine a corresponding offset value $E_S$ in step 303. Each of the plurality of offset values $E_S$ may be determined right after each of the plurality of errors E1 to E15 is determined. Each of the plurality of offset values corresponds to one current unit of the digital-to-analog converter 110. Each of the plurality of offset values $E_S$ may be a digital represents a mismatch of one current unit of the digital-to-analog converter 110.

After the residual offset $\Sigma D$ and each of the plurality of offset values $E_S$ have been determined, the groupings of the sum current $\Sigma I_L$ and the plurality of most-significant-bit currents $I_{64(1)}$ to $I_{64(15)}$ may be changed. To make the change, the sum current $\Sigma I_L$ and each of the plurality of most-significant-bit currents $I_{64(1)}$ to $I_{64(15)}$ may each be coupled to a positive group switch Sip and a negative group switch Sin. Also, the at least one reference current $I_{8A}$ and/or $I_{8B}$, as well as the at least two offset cancellation currents $I_{8C}$ and $I_{8D}$ may each be coupled a positive group switch Sip and a negative group switch Sin. The first terminal of each of the positive group switches Sip and each of the negative group switches Sin may be coupled to the corresponding current cell. The second terminal of each of the positive group switches Sip may be coupled to the positive terminal of the operational amplifier OP. The second terminal of each of the negative group switches Sip may be coupled to the negative terminal of the operational amplifier OP. The controller 140 may be used to control the activation of the positive group switches Sip and the negative group switches Sin. When a positive group switch Sip is activated by the controller 140, the corresponding current cell may be coupled to the positive terminal of the operational amplifier OP. A corresponding negative group switch Sin of the activated positive group switch Sip may be deactivated. And when a negative group switch Sin is activated by the controller 140, the corresponding current cell may be coupled to the negative terminal of the operational amplifier OP. A corresponding positive group switch Sip of the activated negative group switch Sin may be deactivated.

Figure 4:
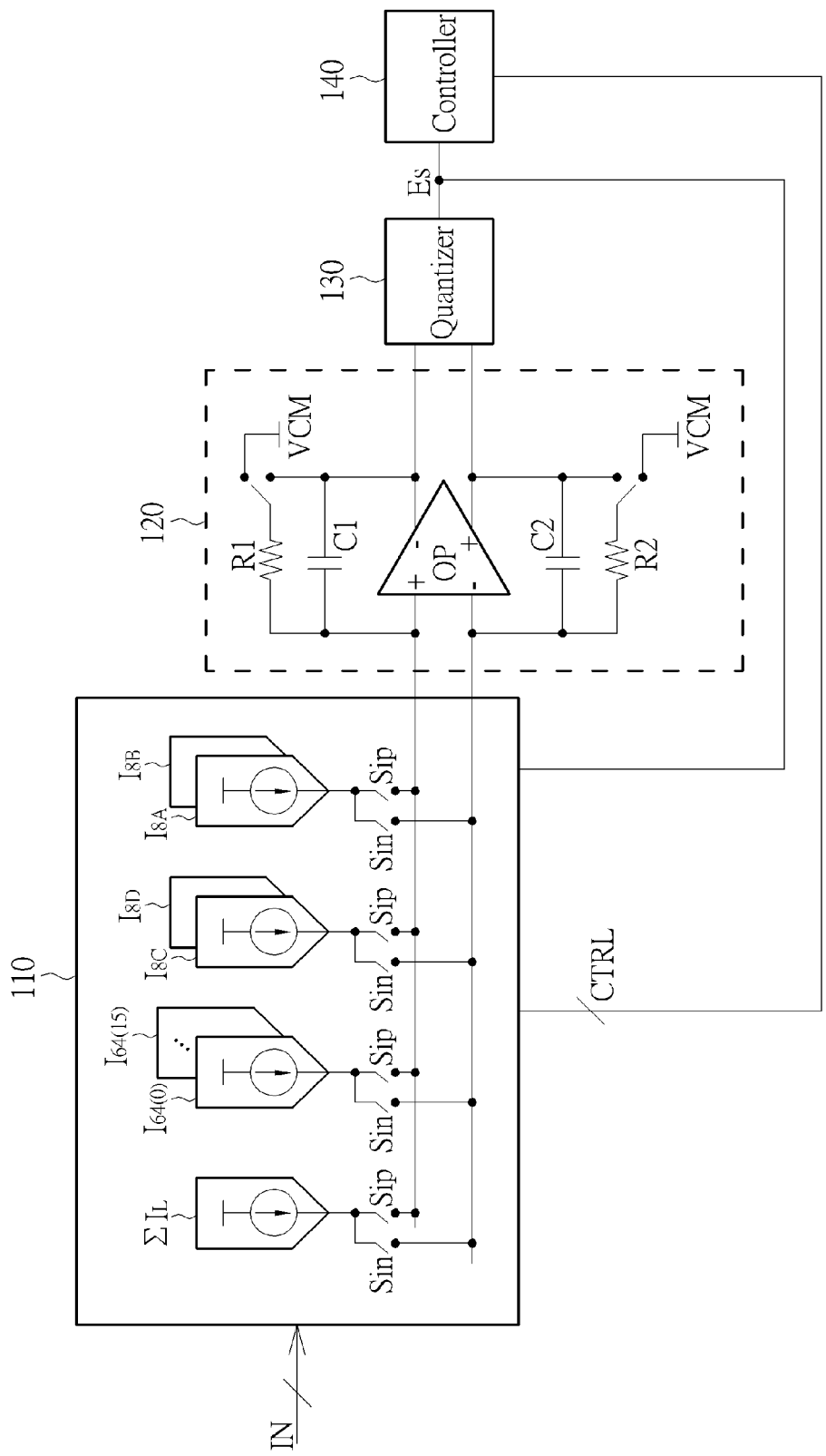
FIG. 4 is a schematic diagram of switching of the current cells of a digital-to-analog converter apparatus in FIG. 1.

FIG. 4 is a schematic diagram of switching of the current cells of a digital-to-analog converter apparatus 100 in FIG. 1.

FIG. 5 may be used to better illustrate a part of the procedure in step 302 and 303. FIG. 5 is a table of calibration of each of the plurality of most-significant-bit currents $I_{64(1)}$ to $I_{64(8)}$. The first group G1 may include the sum current $\Sigma I_L$ and the plurality of most-significant-bit currents $I_{64(9)}$ to $I_{64(15)}$ and the second group G2 may include the plurality of most-significant-bit currents $I_{64(1)}$ to $I_{64(8)}$. The residual offset $\Sigma D$ of the analog to digital converter 110 may be determined by summing and integrating the total current in the first group G1 and the total current of the second group G2 by the integrator.

If the most-significant-bit current $I_{64(1)}$ is to be calibrated, the sum current $\Sigma I_L$ may then be placed in the second group G2 and the most-significant-bit current $I_{64(1)}$ to be calibrated may be placed in the first group G1. The first group G1 may include the plurality of most-significant-bit currents $I_{64(1)}$ and $I_{64(9)}$ to $I_{64(15)}$. The second group G2 may include the sum current $\Sigma I_L$ and the plurality of most-significant-bit currents $I_{64(2)}$ to $I_{64(8)}$. The corresponding positive group switch Sip of the plurality of most-significant-bit currents $I_{64(1)}$ and $I_{64(9)}$ to $I_{64(15)}$ may be activated by the controller 140 to couple the plurality of most-significant-bit currents $I_{64(1)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(2)}$ to $I_{64(8)}$ may be activated to couple the sum current $\Sigma I_L$ and the plurality of most-significant-bit currents $I_{64(2)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. And the error offset $E_{OS}$ may be subtracted from the residual offset $\Sigma D$ to determine the error E1. Afterwards, the quantizer 130 may be used to quantize the error E1 and determine the offset value $E_{S1}$. The offset value $E_{S1}$ may be equivalent to the error E1.

If the most-significant-bit current $I_{64(2)}$ is to be calibrated, the sum current $\Sigma I_L$ may then be placed in the second group G2 and the most-significant-bit current $I_{64(2)}$ to be calibrated may be placed in the first group G1. The first group G1 may include the plurality of most-significant-bit currents $I_{64(2)}$ and $I_{64(9)}$ to $I_{64(15)}$. The second group G2 may include the sum current $\Sigma I_L$ and the plurality of most-significant-bit currents $I_{64(1)}$ and $I_{64(3)}$ to $I_{64(8)}$. The corresponding positive group switch Sip of the plurality of most-significant-bit currents $I_{64(2)}$ and $I_{64(9)}$ to $I_{64(15)}$ may be activated by the controller 140 to couple the plurality of most-significant-bit currents $I_{64(2)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ and $I_{64(3)}$ to $I_{64(8)}$ may be activated to couple the sum current $\Sigma I_L$ and the plurality of most-significant-bit currents $I_{64(1)}$ and $I_{64(3)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E2. Afterwards, the quantizer 130 may be used to quantize the error E2 and determine the offset value $E_{S2}$. The offset value $E_{S2}$ may be equivalent to the accumulated value of the error E2 and the $E_{S1}$.

If the most-significant-bit current $I_{64(3)}$ is to be calibrated, the sum current $\Sigma I_L$ may then be placed in the second group G2 and the most-significant-bit current $I_{64(3)}$ to be calibrated may be placed in the first group G1. The first group G1 may include the plurality of most-significant-bit currents $I_{64(3)}$ and $I_{64(9)}$ to $I_{64(15)}$. The second group G2 may include the sum current $\Sigma I_L$ and the plurality of most-significant-bit currents $I_{64(1)}$, $I_{64(2)}$, and $I_{64(4)}$ to $I_{64(8)}$. The corresponding positive group switch Sip of the plurality of most-significant-bit currents $I_{64(3)}$ and $I_{64(9)}$ to $I_{64(15)}$ may be activated by the controller 140 to couple the plurality of most-significant-bit currents $I_{64(3)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$, $I_{64(2)}$, and $I_{64(4)}$ to $I_{64(8)}$ may be activated to couple the sum current $\Sigma I_L$ and the plurality of most-significant-bit currents $I_{64(1)}$, $I_{64(2)}$, and $I_{64(4)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E3. Afterwards, the quantizer 130 may be used to quantize the error E3 and determine the offset value $E_{S3}$. The offset value $E_{S3}$ may be equivalent the accumulated value of the error E3 and the $E_{S2}$.

If the most-significant-bit current $I_{64(4)}$ is to be calibrated, the sum current $\Sigma I_L$ may then be placed in the second group G2 and the most-significant-bit current $I_{64(4)}$ to be calibrated may be placed in the first group G1. The first group G1 may include the plurality of most-significant-bit currents $I_{64(4)}$ and $I_{64(9)}$ to $I_{64(15)}$. The second group G2 may include the sum current $\Sigma I_L$ and the plurality of most-significant-bit currents $I_{64(1)}$ to $I_{64(3)}$ and $I_{64(5)}$ to $I_{64(8)}$. The corresponding positive group switch Sip of the plurality of most-significant-bit currents $I_{64(4)}$ and $I_{64(9)}$ to $I_{64(15)}$ may be activated by the controller 140 to couple the plurality of most-significant-bit currents $I_{64(4)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ to $I_{64(3)}$ and $I_{64(5)}$ to $I_{64(8)}$ may be activated to couple the sum current $\Sigma I_L$ and the plurality of most-significant-bit currents $I_{64(1)}$ to $I_{64(3)}$ and $I_{64(5)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E4. Afterwards, the quantizer 130 may be used to quantize the error E4 and determine the offset value $E_{S4}$. The offset value $E_{S4}$ may be equivalent the accumulated value of the error E4 and the $E_{S3}$.

If the most-significant-bit current $I_{64(5)}$ is to be calibrated, the sum current $\Sigma I_L$ may then be placed in the second group G2 and the most-significant-bit current $I_{64(5)}$ to be calibrated may be placed in the first group G1. The first group G1 may include the plurality of most-significant-bit currents $I_{64(5)}$ and $I_{64(9)}$ to $I_{64(15)}$. The second group G2 may include the sum current $\Sigma I_L$ and the plurality of most-significant-bit currents $I_{64(1)}$ to $I_{64(4)}$ and $I_{64(6)}$ to $I_{64(8)}$. The corresponding positive group switch Sip of the plurality of most-significant-bit currents $I_{64(5)}$ and $I_{64(9)}$ to $I_{64(15)}$ may be activated by the controller 140 to couple the plurality of most-significant-bit currents $I_{64(5)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ to $I_{64(4)}$ and $I_{64(6)}$ to $I_{64(8)}$ may be activated to couple the sum current $\Sigma I_L$ and the plurality of most-significant-bit currents $I_{64(1)}$ to $I_{64(4)}$ and $I_{64(6)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E5. Afterwards, the quantizer 130 may be used to quantize the error E5 and determine the offset value $E_{S5}$. The offset value $E_{S5}$ may be equivalent the accumulated value of the error E5 and the $E_{S4}$.

If the most-significant-bit current $I_{64(6)}$ is to be calibrated, the sum current $\Sigma I_L$ may then be placed in the second group G2 and the most-significant-bit current $I_{64(6)}$ to be calibrated may be placed in the first group G1. The first group G1 may include the plurality of most-significant-bit currents $I_{64(6)}$ and $I_{64(9)}$ to $I_{64(15)}$. The second group G2 may include the sum current $\Sigma I_L$ and the plurality of most-significant-bit currents $I_{64(1)}$ to $I_{64(5)}$ and $I_{64(7)}$ to $I_{64(8)}$. The corresponding positive group switch Sip of the plurality of most-significant-bit currents $I_{64(6)}$ and $I_{64(9)}$ to $I_{64(15)}$ may be activated by the controller 140 to couple the plurality of most-significant-bit currents $I_{64(6)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ to $I_{64(5)}$ and $I_{64(7)}$ to $I_{64(8)}$ may be activated to couple the sum current $\Sigma I_L$ and the plurality of most-significant-bit currents $I_{64(1)}$ to $I_{64(5)}$ and $I_{64(7)}$ to $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E6. Afterwards, the quantizer 130 may be used to quantize the error E6 and determine the offset value $E_{S6}$. The offset value $E_{S6}$ may be equivalent the accumulated value of the error E6 and the $E_{S5}$.

If the most-significant-bit current $I_{64(7)}$ is to be calibrated, the sum current $\Sigma I_L$ may then be placed in the second group G2 and the most-significant-bit current $I_{64(5)}$ to be calibrated may be placed in the first group G1. The first group G1 may include the plurality of most-significant-bit currents $I_{64(7)}$ and $I_{64(9)}$ to $I_{64(15)}$. The second group G2 may include the sum current $\Sigma I_L$ and the plurality of most-significant-bit currents $I_{64(1)}$ to $I_{64(6)}$ and $I_{64(8)}$. The corresponding positive group switch Sip of the plurality of most-significant-bit currents $I_{64(7)}$ and $I_{64(9)}$ to $I_{64(15)}$ may be activated by the controller 140 to couple the plurality of most-significant-bit currents $I_{64(7)}$ and $I_{64(9)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ to $I_{64(6)}$ and $I_{64(8)}$ may be activated to couple the sum current $\Sigma I_L$ and the plurality of most-significant-bit currents $I_{64(1)}$ to $I_{64(6)}$ and $I_{64(8)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset ΣD to determine the error E7. Afterwards, the quantizer 130 may be used to quantize the error E7 and determine the offset value $E_{S7}$. The offset value $E_{S7}$ may be equivalent the accumulated value of the error E7 and the $E_{S6}$.

If the most-significant-bit current $I_{64(8)}$ is to be calibrated, the sum current $\Sigma I_L$ may then be placed in the second group G2 and the most-significant-bit current $I_{64(5)}$ to be calibrated may be placed in the first group G1. The first group G1 may include the plurality of most-significant-bit currents $I_{64(8)}$ to $I_{64(15)}$. The second group G2 may include the sum current $\Sigma I_L$ and the plurality of most-significant-bit currents $I_{64(1)}$ to $I_{64(7)}$. The corresponding positive group switch Sip of the plurality of most-significant-bit currents $I_{64(8)}$ to $I_{64(15)}$ may be activated by the controller 140 to couple the plurality of most-significant-bit currents $I_{64(8)}$ to $I_{64(15)}$ to the positive input terminal of the operational amplifier OP. The corresponding negative group switch Sin of the sum current $\Sigma I_L$ and the plurality of most-significant-bit currents $I_{64(1)}$ to $I_{64(7)}$ may be activated to couple the sum current $\Sigma I_L$ and the plurality of most-significant-bit currents $I_{64(1)}$ to $I_{64(7)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset ΣD to determine the error E8. Afterwards, the quantizer 130 may be used to quantize the error E8 and determine the offset value $E_{S8}$. The offset value $E_{S8}$ may be equivalent the accumulated value of the error E8 and the $E_{S7}$.

FIG. 6 may be used to better illustrate another part of the procedure in step 302 and 303. FIG. 6 is a table of calibration of each of the plurality of most-significant-bit currents $I_{64(9)}$ to $I_{64(15)}$. The first group G1 may include the sum current $\Sigma I_L$ and the plurality of most-significant-bit currents $I_{64(1)}$ to $I_{64(7)}$ and the second group G2 may include the plurality of most-significant-bit currents $I_{64(8)}$ to $I_{64(15)}$. The residual offset ΣD of the analog to digital converter 110 may be determined by summing and integrating the total current in the first group G1 and the total current of the second group G2 by the integrator.

If the most-significant-bit current $I_{64(9)}$ is to be calibrated, the sum current $\Sigma I_L$ may then be placed in the second group G2 and the most-significant-bit current $I_{64(9)}$ to be calibrated may be placed in the first group G1. The first group G1 may include the plurality of most-significant-bit currents $I_{64(1)}$ to $I_{64(7)}$ and $I_{64(9)}$. The second group G2 may include the sum current $\Sigma I_L$ and the plurality of most-significant-bit currents $I_{64(8)}$ and $I_{64(10)}$ to $I_{64(15)}$. The corresponding positive group switch Sip of the plurality of most-significant-bit currents $I_{64(1)}$ to $I_{64(7)}$ and $I_{64(9)}$ may be activated by the controller 140 to couple the plurality of most-significant-bit currents $I_{64(1)}$ to $I_{64(7)}$ and $I_{64(9)}$ to the positive input terminal of the operational amplifier OP. The corresponding negative group switch Sin of the sum current $\Sigma I_L$ and the plurality of most-significant-bit currents $I_{64(8)}$ and $I_{64(10)}$ to $I_{64(15)}$ may be activated to couple the sum current $\Sigma I_L$ and the plurality of most-significant-bit currents $I_{64(8)}$ and $I_{64(10)}$ to $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset ΣD to determine the error E9. Afterwards, the quantizer 130 may be used to quantize the error E9 and determine the offset value $E_{S9}$. The offset value $E_{S9}$ may be equivalent the accumulated value of the error E9 and the $E_{S9}$.

If the most-significant-bit current $I_{64(10)}$ is to be calibrated, the sum current $\Sigma I_L$ may then be placed in the second group G2 and the most-significant-bit current $I_{64(10)}$ to be calibrated may be placed in the first group G1. The first group G1 may include the plurality of most-significant-bit currents $I_{64(1)}$ to $I_{64(7)}$ and $I_{64(10)}$. The second group G2 may include the sum current $\Sigma I_L$ and the plurality of most-significant-bit currents $I_{64(8)}$ to $I_{64(9)}$ and $I_{64(11)}$ to $I_{64(15)}$. The corresponding positive group switch Sip of the plurality of most-significant-bit currents $I_{64(1)}$ to $I_{64(7)}$ and $I_{64(10)}$ may be activated by the controller 140 to couple the plurality of most-significant-bit currents $I_{64(1)}$ to $I_{64(7)}$ and $I_{64(10)}$ to the positive input terminal of the operational amplifier OP. The corresponding negative group switch Sin of the sum current $\Sigma I_L$ and the plurality of most-significant-bit currents $I_{64(8)}$ to $I_{64(9)}$ and $I_{64(11)}$ to $I_{64(15)}$ may be activated to couple the sum current $\Sigma I_L$ and the plurality of most-significant-bit currents $I_{64(8)}$ to $I_{64(9)}$ and $I_{64(11)}$ to $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset ΣD to determine the error E10. Afterwards, the quantizer 130 may be used to quantize the error E10 and determine the offset value $E_{S10}$. The offset value $E_{S10}$ may be equivalent the accumulated value of the error E10 and the $E_{S9}$.

If the most-significant-bit current $I_{64(11)}$ is to be calibrated, the sum current $\Sigma I_L$ may then be placed in the second group G2 and the most-significant-bit current $I_{64(11)}$ to be calibrated may be placed in the first group G1. The first group G1 may include the plurality of most-significant-bit currents $I_{64(1)}$ to $I_{64(7)}$ and $I_{64(11)}$. The second group G2 may include the sum current $\Sigma I_L$ and the plurality of most-significant-bit currents $I_{64(8)}$ to $I_{64(10)}$ and $I_{64(12)}$ to $I_{64(15)}$. The corresponding positive group switch Sip of the plurality of most-significant-bit currents $I_{64(1)}$ to $I_{64(7)}$ and $I_{64(11)}$ may be activated by the controller 140 to couple the plurality of most-significant-bit currents $I_{64(1)}$ to $I_{64(7)}$ and $I_{64(11)}$ to the positive input terminal of the operational amplifier OP. The corresponding negative group switch Sin of the sum current $\Sigma I_L$ and the plurality of most-significant-bit currents $I_{64(8)}$ to $I_{64(10)}$ and $I_{64(12)}$ to $I_{64(15)}$ may be activated to couple the sum current $\Sigma I_L$ and the plurality of most-significant-bit currents $I_{64(8)}$ to $I_{64(10)}$ and $I_{64(12)}$ to $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset ΣD to determine the error E11. Afterwards, the quantizer 130 may be used to quantize the error E11 and determine the offset value $E_{S11}$. The offset value $E_{S11}$ may be equivalent the accumulated value of the error E11 and the $E_{S10}$.

If the most-significant-bit current $I_{64(12)}$ is to be calibrated, the sum current $\Sigma I_L$ may then be placed in the second group G2 and the most-significant-bit current $I_{64(12)}$ to be calibrated may be placed in the first group G1. The first group G1 may include the plurality of most-significant-bit currents $I_{64(1)}$ to $I_{64(7)}$ and $I_{64(12)}$. The second group G2 may include the sum current $\Sigma I_L$ and the plurality of most-significant-bit currents $I_{64(8)}$ to $I_{64(11)}$ and $I_{64(13)}$ to $I_{64(15)}$. The corresponding positive group switch Sip of the plurality of most-significant-bit currents $I_{64(1)}$ to $I_{64(7)}$ and $I_{64(12)}$ may be activated by the controller 140 to couple the plurality of most-significant-bit currents $I_{64(1)}$ to $I_{64(7)}$ and $I_{64(12)}$ to the positive input terminal of the operational amplifier OP. The corresponding negative group switch Sin of the sum current $\Sigma I_L$ and the plurality of most-significant-bit currents $I_{64(8)}$ to $I_{64(11)}$ and $I_{64(13)}$ to $I_{64(15)}$ may be activated to couple the sum current $\Sigma I_L$ and the plurality of most-significant-bit currents $I_{64(8)}$ to $I_{64(11)}$ and $I_{64(13)}$ to $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E12. Afterwards, the quantizer 130 may be used to quantize the error E12 and determine the offset value $E_{S12}$. The offset value $E_{S12}$ may be equivalent the accumulated value of the error E12 and the $E_{S11}$.

If the most-significant-bit current $I_{64(13)}$ is to be calibrated, the sum current $\Sigma I_L$ may then be placed in the second group G2 and the most-significant-bit current $I_{64(13)}$ to be calibrated may be placed in the first group G1. The first group G1 may include the plurality of most-significant-bit currents $I_{64(1)}$ to $I_{64(7)}$ and $I_{64(13)}$. The second group G2 may include the sum current $\Sigma I_L$ and the plurality of most-significant-bit currents $I_{64(8)}$ to $I_{64(12)}$ and $I_{64(14)}$ to $I_{64(15)}$. The corresponding positive group switch Sip of the plurality of most-significant-bit currents $I_{64(1)}$ to $I_{64(7)}$ and $I_{64(13)}$ may be activated by the controller 140 to couple the plurality of most-significant-bit currents $I_{64(1)}$ to $I_{64(7)}$ and $I_{64(13)}$ to the positive input terminal of the operational amplifier OP. The corresponding negative group switch Sin of the sum current $\Sigma I_L$ and the plurality of most-significant-bit currents $I_{64(8)}$ to $I_{64(12)}$ and $I_{64(14)}$ to $I_{64(15)}$ may be activated to couple the sum current $\Sigma I_L$ and the plurality of most-significant-bit currents $I_{64(8)}$ to $I_{64(12)}$ and $I_{64(14)}$ to $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E13. Afterwards, the quantizer 130 may be used to quantize the error E13 and determine the offset value $E_{S13}$. The offset value $E_{S13}$ may be equivalent the accumulated value of the error E13 and the $E_{S12}$.

If the most-significant-bit current $I_{64(14)}$ is to be calibrated, the sum current $\Sigma I_L$ may then be placed in the second group G2 and the most-significant-bit current $I_{64(14)}$ to be calibrated may be placed in the first group G1. The first group G1 may include the plurality of most-significant-bit currents $I_{64(1)}$ to $I_{64(7)}$ and $I_{64(14)}$. The second group G2 may include the sum current $\Sigma I_L$ and the plurality of most-significant-bit currents $I_{64(8)}$ to $I_{64(13)}$ and $I_{64(15)}$. The corresponding positive group switch Sip of the plurality of most-significant-bit currents $I_{64(1)}$ to $I_{64(7)}$ and $I_{64(14)}$ may be activated by the controller 140 to couple the plurality of most-significant-bit currents $I_{64(1)}$ to $I_{64(7)}$ and $I_{64(14)}$ to the positive input terminal of the operational amplifier OP. The corresponding negative group switch Sin of the sum current $\Sigma I_L$ and the plurality of most-significant-bit currents $I_{64(8)}$ to $I_{64(13)}$ and $I_{64(15)}$ may be activated to couple the sum current $\Sigma I_L$ and the plurality of most-significant-bit currents $I_{64(8)}$ to $I_{64(13)}$ and $I_{64(15)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E14. Afterwards, the quantizer 130 may be used to quantize the error E14 and determine the offset value $E_{S14}$. The offset value $E_{S14}$ may be equivalent the accumulated value of the error E14 and the $E_{S13}$.

If the most-significant-bit current $I_{64(15)}$ is to be calibrated, the sum current $\Sigma I_L$ may then be placed in the second group G2 and the most-significant-bit current $I_{64(15)}$ to be calibrated may be placed in the first group G1. The first group G1 may include the plurality of most-significant-bit currents $I_{64(1)}$ to $I_{64(7)}$ and $I_{64(15)}$. The second group G2 may include the sum current $\Sigma I_L$ and the plurality of most-significant-bit currents $I_{64(8)}$ to $I_{64(14)}$. The corresponding positive group switch Sip of the plurality of most-significant-bit currents $I_{64(1)}$ to $I_{64(7)}$ and $I_{64(15)}$ may be activated by the controller 140 to couple the plurality of most-significant-bit currents $I_{64(1)}$ to $I_{64(7)}$ and $I_{64(15)}$ to the positive input terminal of the operational amplifier OP. The corresponding negative group switch Sin of the sum current $\Sigma I_L$ and the plurality of most-significant-bit currents $I_{64(8)}$ to $I_{64(14)}$ may be activated to couple the sum current $\Sigma I_L$ and the plurality of most-significant-bit currents $I_{64(8)}$ to $I_{64(14)}$ to the negative input terminal of the operational amplifier OP. The total current of the first group G1 and the total current of the second group G2 may be summed up and integrated by the integrator to determine an error offset $E_{OS}$ between the first group G1 and the second group G2. The error offset $E_{OS}$ may be subtracted from the residual offset $\Sigma D$ to determine the error E15. Afterwards, the quantizer 130 may be used to quantize the error E15 and determine the offset value $E_{S15}$. The offset value $E_{S15}$ may be equivalent the accumulated value of the error E15 and the $E_{S14}$.

In step 304, after each of the plurality of offset values $E_S$ is generated by the quantizer 130, each of the plurality of offset values $E_S$ is saved in the error mapping table 111 of the digital-to-analog converter 110.

The digital-to-analog converter 110 may then be calibrated in step 206 according to the plurality of offset values $E_S$. The resistor-capacitor circuit 120 may be configured to form the low-pass filter in step 207. The low-pass filter is formed by having the second terminal of the first switch SW1 selectively coupled to the first output terminal of the operational amplifier OP and the second switch SW2 of the resistor-capacitor circuit 120 selectively coupled to the second output terminal of the operational amplifier OP. In doing so, the digital-to-analog converter 110 and the low-pass filter may perform digital-to-analog conversion. A digital signal may then be propagated through the digital-to-analog converter apparatus 100 in step 208. The error compensation in step 209 may be performed by compensating for the difference between the digital signal and a corresponding offset value $E_S$ using currents generated by the calibration current cells C-DAC. Not all of the calibration current cells are used during the calibration and/or the digital-to-analog conversion. The analog signal is generated in step 210 according to the digital signal.

As result, a digital-to-analog converter apparatus having digital-intensive mismatch correction is developed. For the example, 10 bit digital-to-analog converter is segmented into 4-6. The 4-bit most-significant-bit current cells M-DAC include fifteen equally weighted current cells, and the 6-bit least-significant-bit current cells L-DAC include six binary weighted current cells. The calibration current cells C-DAC includes 4 current cells with value 8 times the current unit and fine current cells having value ½ one half, ¼ one quarter, and ⅛ one eighth of current. The four current cells of calibration current cells C-DAC may be used to extend calibration range and the three fine current cells of calibration current cells C-DAC may be used to increase correction resolution. After the offset values Es of the corresponding current cells have been generated, the offset values Es may be saved in the error mapping table 111. And then, a corresponding mismatch may be digitally calculated during digital-to-analog conversion and compensated for in real time.

The embodiments described presents a digital-to-analog converter apparatus having a resistor-capacitor circuit that may be configured to form either an integrator or a low-pass filter according to the need of the digital-to-analog converter apparatus. Having a reconfigurable resistor-capacitor circuit will allow elimination of forming additional circuits and, therefore, saving in fabrication area of the digital-to-analog converter apparatus.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter apparatus comprising:
    a digital-to-analog converter having an input bus terminal, a first output terminal, a second output terminal, and a plurality of control terminals, and configured to generate a plurality of currents;
    a resistor-capacitor circuit configured to form an integrator to form a sigma-delta analog-to-digital converter during calibration and configured to form a low-pass filter during a digital-to-analog conversion, the resistor-capacitor circuit comprising:
        an operational amplifier having a first input terminal coupled to the first output terminal of the digital-to-analog converter, a second input terminal coupled to the second output terminal of the digital-to-analog converter, a first output terminal, and a second output terminal;
        a first capacitor having a first terminal coupled to the first input terminal of the operational amplifier and a second terminal coupled to the first output terminal of the operational amplifier;
        a second capacitor having a first terminal coupled to the second input terminal of the operational amplifier and a second terminal coupled to the second output terminal of the operational amplifier;
        a first resistor having a first terminal coupled to the first input terminal of the operational amplifier and a second terminal;
        a second resistor having a first terminal coupled to the second input terminal of the operational amplifier and a second terminal;
        a first switch having a first terminal coupled to the second terminal of the first resistor, a second terminal selectively coupled to a common mode voltage or to the first output terminal of the operational amplifier; and
        a second switch having a first terminal coupled to the second terminal of the second resistor, a second terminal selectively coupled to the common mode voltage or to the second output terminal of the operational amplifier;
    a quantizer having a first input terminal coupled to the first output terminal of the operational amplifier, a second input terminal coupled to the second output terminal of the operational amplifier, and an output terminal, and configured to generate a plurality of offset values according to outputs of the operational amplifier; and
    a controller having an input terminal coupled to the output terminal of the quantizer, and an output bus terminal coupled to the plurality of control terminals of the digital-to-analog converter, and configured to control coupling of the plurality of currents to the operational amplifier according to the plurality of offset values.

2. The digital-to-analog converter apparatus of claim 1, wherein the digital-to-analog converter comprises:
    calibration current cells, least-significant-bit current cells, and most-significant-bit current cells coupled to the output bus terminal of the controller and configured to generate the plurality of currents.

3. The digital-to-analog converter apparatus of claim 2, wherein at least one calibration current cell is used to generate a reference current.

4. The digital-to-analog converter apparatus of claim 2, wherein at least two calibration current cells are used to generate offset cancellation currents.

5. The digital-to-analog converter apparatus of claim 2, wherein not all of the calibration current cells are used during the calibration and/or the digital-to-analog conversion.

6. The digital-to-analog converter apparatus of claim 1, wherein the digital-to-analog converter comprises:
    an error mapping table to store the plurality of offset values.

7. The digital-to-analog converter apparatus of claim 1, wherein the digital-to-analog converter does not turn off at any time during operation to reduce power consumption.

8. A method of operation of a digital-to-analog converter apparatus comprising:
    configuring a resistor-capacitor circuit to form an integrator;
    generating a plurality of currents by a digital-to-analog converter;
    performing integration on the plurality of currents by the integrator to generate outputs;
    generating a plurality of offset values according to the outputs of the integrator;
    saving the plurality of offset values to an error mapping table of the digital-to-analog converter;
    calibrating the digital-to-analog converter according to the plurality of offset values;
    configuring the resistor-capacitor circuit to form a low-pass filter;
    propagating a digital signal through the digital-to-analog converter and the resistor-capacitor circuit after calibrating the digital-to-analog converter and forming the low-pass filter;
    performing error compensation to the digital signal according to the plurality of offset values saved in the error mapping table; and
    generating an analog signal according to the digital signal.

9. The method of claim 8, wherein performing error compensation to the digital signal according to the plurality of offset values saved in the error mapping table comprises compensating for a difference between the digital signal and a corresponding offset value using at least one reference current.

10. The method of claim 8, wherein performing error compensation to the digital signal according to the plurality of offset values saved in the error mapping table comprises compensating for a difference between the digital signal and a corresponding offset value using at least one reference current and at least two offset cancellation currents.

11. The method of claim 8, wherein the digital-to-analog converter does not turn off at any time during operation to reduce power consumption.

12. The method of claim 8, wherein each of the plurality of offset values corresponds to one current unit of the digital-to-analog converter.

13. A method of calibration of a digital-to-analog converter apparatus comprising:
- summing a plurality of least-significant-bit currents by a digital-to-analog converter to generate a sum current;
- integrating each of a plurality of most-significant-bit currents and the sum current by an integrator to generate a plurality of outputs;
- quantizing of the plurality of outputs by a quantizer to generate a plurality of offset values; and
- saving each of the plurality of offset values in the digital-to-analog converter;
- wherein the sum current is placed in a first group and the plurality of most-significant-bit currents are placed in a second group when summing the plurality of least-significant-bit currents to generate the sum current.

14. The method of claim 13, wherein the sum current is placed in the second group and each of the plurality of most-significant-bit currents are placed in the first group when integrating each of the plurality of most-significant-bit currents from the sum current by the integrator to generate the plurality of outputs.

15. The method of claim 14, wherein the sum current is placed in the second group and each of the plurality of most-significant-bit currents are placed in the first group by a controller according to the plurality of offset values.

16. The method of claim 13, wherein full swing of the digital-to-analog converter during calibration is determined according to at least one reference current generated by the digital-to-analog converter.

17. The method of claim 13, wherein at least two offset cancellation currents are used to compensate for overshoot of currents in the first group and second group.

18. The method of claim 13 further comprising configuring a resistor-capacitor circuit to form the integrator.

19. The method of claim 13, wherein each of the plurality of offset values corresponds to one current unit of the digital-to-analog converter.

* * * * *